United States Patent
Shirai et al.

[19]

[11] Patent Number: 6,040,110
[45] Date of Patent: Mar. 21, 2000

[54] PROCESS AND APPARATUS FOR THE REMOVAL OF RESIST

[75] Inventors: Seiichirou Shirai; Toshihiko Onozuka; Takayuki Noishiki; Satoshi Sakai; Katsuhiro Sasajima, all of Tokyo; Eiji Toyoda; Makoto Namikawa, both of Osaka, all of Japan

[73] Assignee: Nitto Denko Corporation, Osaka, Japan

[21] Appl. No.: 09/129,842

[22] Filed: Aug. 6, 1998

[30] Foreign Application Priority Data

Aug. 12, 1997 [JP] Japan ..................................... 9-217358

[51] Int. Cl.[7] .................................................. G03C 11/12
[52] U.S. Cl. .......................... 430/258; 430/329; 438/747; 438/725; 134/1.3; 216/40
[58] Field of Search ..................................... 430/258, 329, 430/325, 323; 216/40; 134/1.3; 438/747, 725

[56] References Cited

U.S. PATENT DOCUMENTS

| | | | |
|---|---|---|---|
| 4,853,669 | 8/1989 | Guckel et al. ................................ | 338/4 |
| 4,999,689 | 3/1991 | Iguchi et al. ............................ | 357/23.6 |
| 5,466,325 | 11/1995 | Mizuno et al. .......................... | 156/344 |
| 5,874,200 | 2/1999 | Ra et al. .................................. | 430/313 |

*Primary Examiner*—Janet Baxter
*Assistant Examiner*—Yvetté M. Clarke
*Attorney, Agent, or Firm*—Sughrue, Mion, Zinn, Macpeak & Seas, PLLC

[57] ABSTRACT

The present invention provides a process for the removal of a resist layer formed on a semiconductor substrate, which enables easy removal of a resist layer without causing any damage on a gate oxide layer, and an apparatus therefor. The process comprises the steps of forming a gate oxide layer on the semiconductor substrate; forming a resist layer as a resist pattern on the gate oxide layer; removing the gate oxide layer at unnecessary area utilizing the resist layer as a mask; applying a pressure-sensitive adhesive sheet to the semiconductor substrate such that the gate oxide layer left on the semiconductor substrate and the resist layer are masked, and peeling the pressure-sensitive adhesive sheet together with the resist layer off the semiconductor substrate to separate and remove the resist layer from the semiconductor substrate.

12 Claims, 5 Drawing Sheets

PROCESS AND APPARATUS FOR THE REMOVAL OF RESIST

FIELD OF THE INVENTION

The present invention relates to a process and apparatus for the removal of a resist which allows a resist layer formed particularly on a semiconductor substrate in semiconductor production technique to be removed at an enhanced efficiency.

BACKGROUND OF THE INVENTION

The technique described hereinafter has been studied by the inventors to study and accomplish the present invention. This technique is summarized as follows.

A process for the production of a semiconductor device comprises forming a resist layer as a resist pattern on, e.g., a silicon semiconductor wafer (semiconductor substrate), subjecting the silicon semiconductor wafer to treatment such as injection of impurity ion and etching using the resist layer as a mask, and then removing unnecessary resist layer by means of an ashing apparatus (carbonization apparatus) to form a circuit element or wiring.

In recent years, with the enhancement of integration or function of semiconductor devices, the development of devices comprising memory and logic mounted thereon in admixture has been under way.

In the design of such a device, it is necessary that two gate oxide layers having different thicknesses be formed in the same chip.

To this end, the first gate oxide layer thus formed is patterned with a resist layer, etched using the resist layer as a mask, and then freed of the resist layer.

In this manner, the gate oxide layer is left on the semiconductor substrate corresponding to the patterning resist layer.

Thereafter, a second gate oxide layer is formed on the remaining gate oxide layer to form two gate oxide layers. The second gate oxide layer can be patterned in the same manner as in the patterning of the first gate oxide layer.

Various ashing apparatus are described in, e.g., the October 1994, issue of "Monthly Semiconductor World", Press Journal, Sep. 20, 1994, pp. 98–101.

However, the plasma ashing technique is disadvantageous in that since a resist layer is formed directly on a gate oxide layer, and then removed after patterning, damage or stain on the gate oxide layer occurring at the step of removing the resist layer has a critical effect on the device properties.

In order to remove the resist layer not causing damage or stain on the gate oxide layer, a wet process in which a chemical liquid is used or a dry process in which an ashing apparatus which hardly gives damage is used.

However, the foregoing wet process is disadvantageous in that the use of a solvent worsens the working atmosphere. On the other hand, the foregoing dry process using an ashing apparatus is disadvantageous in that plasma treatment gives damage on the gate oxide layer.

SUMMARY OF THE INVENTION

It is therefore an object of the present invention to provide a process and apparatus for the removal of a resist layer which enables easy removal of a resist layer without causing damage on a gate oxide layer.

The foregoing and other objects and novel features of the present invention will be apparent from the following description and accompanying drawings.

The essence of a typical invention among the inventions disclosed in the present application will be briefly described hereinafter.

The process for the removal of a resist layer according to the present invention comprises a step of forming a gate oxide layer on a semiconductor substrate, a step of forming a resist layer as a resist pattern on the gate oxide layer and removing the gate oxide layer at unnecessary area utilizing the resist layer as a mask, a step of applying a pressure-sensitive adhesive sheet to the semiconductor substrate such that the gate oxide layer left on the semiconductor substrate and the resist layer are masked, and a step of peeling the pressure-sensitive adhesive sheet together with the resist layer off the semiconductor substrate to separate and remove the resist layer from the semiconductor substrate. In some cases, the removal of the gate oxide layer at unnecessary area can be effected incompletely such that the gate oxide layer having a reduced thickness remains at the unnecessary area.

The process of the present invention does not require the use of an ashing method, making it possible to remove a resist layer easily without giving any damage on a gate oxide layer.

Further, the process of the present invention requires no chemical liquid and hence no solvent, making it possible to remove a resist layer from a semiconductor substrate without giving any stain on a gate oxide layer and deteriorating the working atmosphere.

As a result, the properties and reliability of a semiconductor circuit formed on the semiconductor substrate can be improved. Further, the yield of semiconductor substrate can be enhanced.

Furthermore, the process of the present invention can comprises, after peeling the pressure-sensitive adhesive sheet together with the resist layer off the semiconductor substrate, forming at least another gate oxide layer so as to cover the gate oxide layer left on the semiconductor substrate.

The apparatus for the removal of a resist according to the present invention comprises a sheet applying portion for applying a pressure-sensitive adhesive sheet to a semiconductor substrate while masking a gate oxide layer formed thereon which has been removed at unnecessary area and a resist layer formed on the gate oxide layer as a resist pattern and a sheet peeling portion for peeling the pressure-sensitive adhesive sheet together with the resist layer from the substrate to remove the resist layer from the semiconductor substrate.

BRIEF DESCRIPTION OF THE DRAWINGS

By way of example and to make the description more clear, reference is made to the accompanying drawings in which:

FIGS. 3(a), (b), (c) and (d) are sectional views illustrating an embodiment of the steps of forming a gate oxide layer in the process for the removal of a resist according to the present invention;

FIGS. 4(a), (b), (c) and (d) are partially sectional views and sectional views illustrating an embodiment of the process for the removal of a resist according to the present invention; and FIG. 5 is a graph illustrating by way of example the measurements of the initial breakdown voltage of a gate oxide layer from which a resist layer has been removed by the process for the removal of a resist according to the present invention, wherein the reference numeral 1 indicates a semiconductor wafer (semiconductor substrate), the reference numeral 2 indicates a gate oxide layer, the reference numeral 3 indicates a resist layer, the reference numeral 4 indicates a pressure-sensitive adhesive tape (pressure-sensitive adhesive sheet), the reference numeral 4a indicates a separator, the reference numeral 5 indicates a tape applying portion (sheet applying portion), the reference numeral 5a indicates an application table 5a, the reference numeral 5b indicates a vacuum tank, the reference numeral 5c indicates a pressure roller, the reference numeral 6 indicates a tape peeling portion (sheet peeling portion), the reference numeral 6a indicates a peeling table, the reference numeral 6b indicates a UV irradiation unit, the reference numeral 7 indicates a tape feeding portion, the reference numeral 8 indicates a tape winding portion, the reference numeral 9 indicates a separator winding portion, the reference numeral 10 indicates a loading unit, the reference numeral 11 indicates an aligner unit, the reference numeral 12 indicates a robot unit, and the reference numeral 13 indicates an unloading unit.

DETAILED DESCRIPTION OF THE INVENTION

Embodiments of the present invention will be further described in connection with the accompanying drawings.

Figure 1:
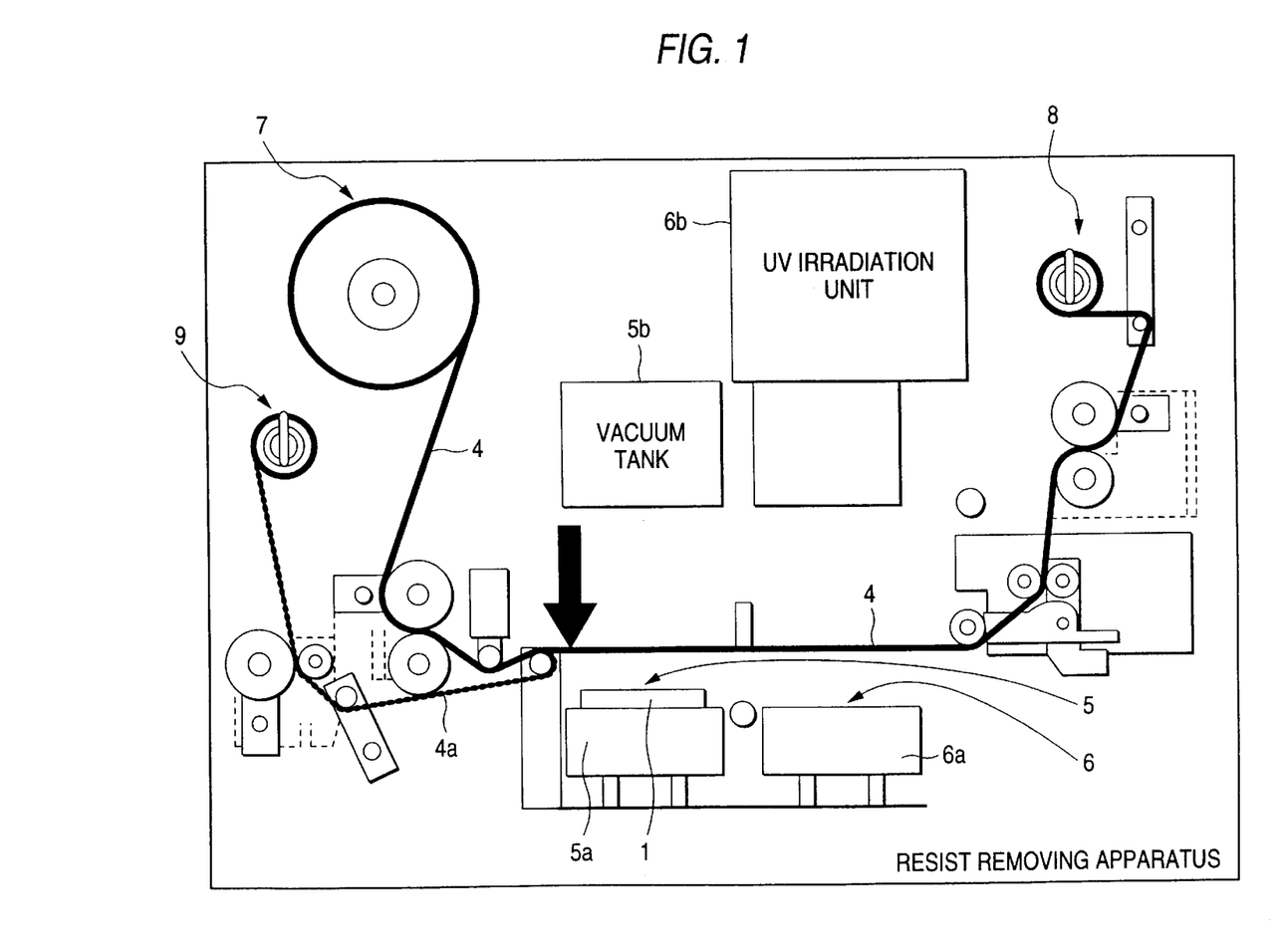
FIG. 1 is a schematic diagram illustrating an embodiment of the structure of the resist removing apparatus according to the present invention.
Figure 2:
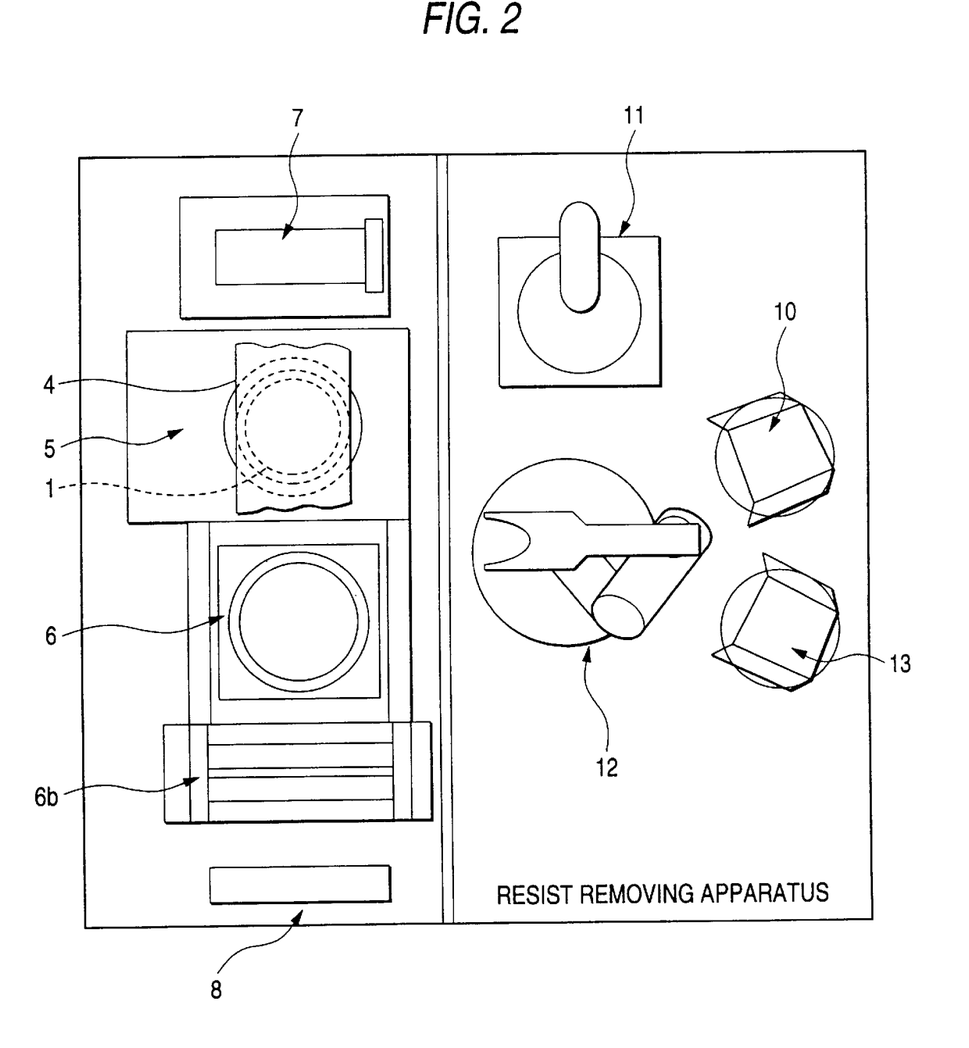
FIG. 2 is a plan view illustrating the configuration of the resist removing apparatus shown in FIG. 1.
Figure 3:
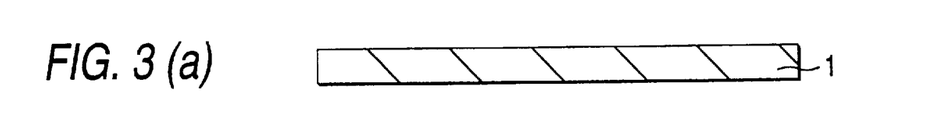
Figure 4:
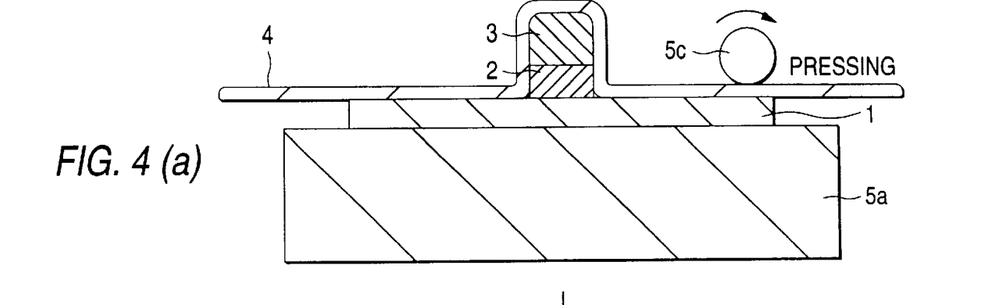
Figure 5:
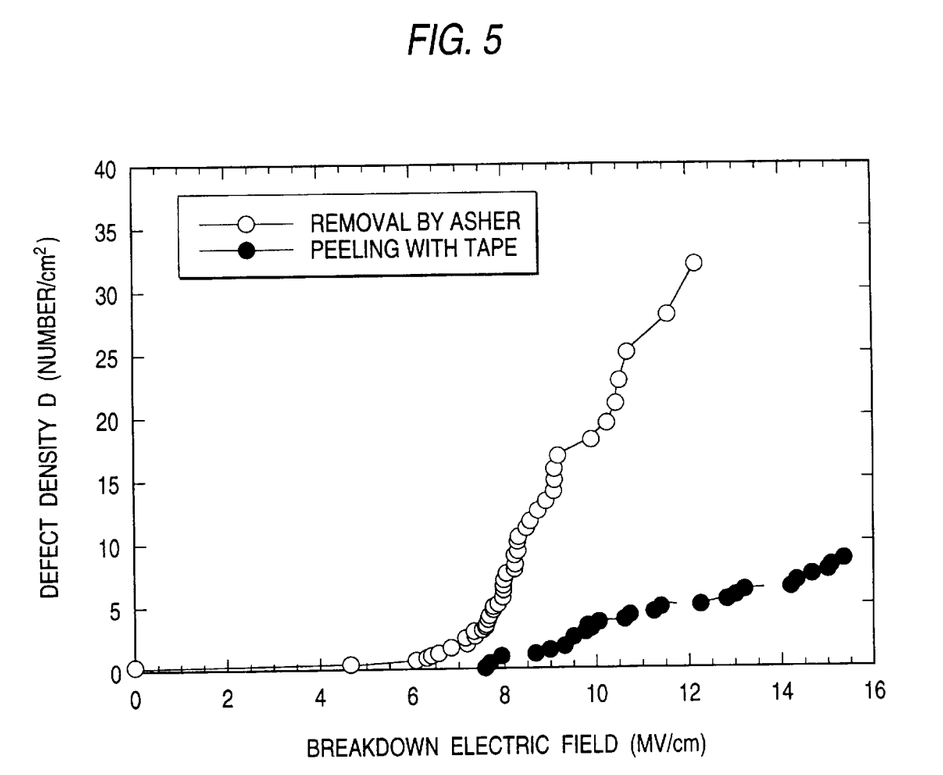

FIG. 1 is a schematic diagram illustrating an embodiment of the structure of the resist removing apparatus according to the present invention. FIG. 2 is a plan view illustrating the structure of the resist removing apparatus shown in FIG. 1. FIG. 3 is a sectional view illustrating an embodiment of the process for the formation of a gate oxide layer in the process for the removal of a resist according to the present invention. FIG. 4 comprises partially sectional views and sectional views illustrating an embodiment of the process for the removal of a resist according to the present invention. FIG. 5 is a graph illustrating an example of measurements of the initial breakdown voltage of a gate oxide layer from which a resist layer has been removed by the resist removing process according to the present invention.

In the present embodiment of the resist removing apparatus of the present invention, a semiconductor producing process is effected which comprises forming a resist layer 3 on a gate oxide layer 2 formed on a semiconductor wafer 1 (semiconductor substrate) made of silicon as a mask for use in the etching of the gate oxide layer 2 at unnecessary area, etching the gate oxide layer 2 at unnecessary area using the resist layer 3 as a mask, and then removing the resist layer 3 with a pressure-sensitive adhesive sheet.

The pressure-sensitive adhesive sheet to be used in the present embodiment of the present invention comprises a pressure-sensitive adhesive layer having a desired thickness provided on a film substrate. The pressure-sensitive adhesive layer may be of non-curing type. Preferably, the pressure-sensitive adhesive layer is made of a curing type pressure-sensitive adhesive containing a pressure-sensitive adhesive polymer such as acrylic polymer, a curing compound and a polymerization catalyst. In particular, it is preferably an ultraviolet-curing type pressure-sensitive adhesive sheet.

Examples of the pressure-sensitive adhesive include a composition comprising 100 parts by weight of an acrylic polymer having a molecular weight of several hundred thousands, tens to hundreds parts by weight of a photopolymerizable polyfunctional compound, and several parts by weight of a crosslinking agent and a photopolymerization initiator. The thickness of the pressure-sensitive adhesive is generally from about 10 to 150 μm.

Accordingly, the present embodiment will be described hereinafter with reference to the case where the pressure-sensitive adhesive sheet is a tape-like ultraviolet-curing type pressure-sensitive adhesive sheet 4.

The structure of the resist removing apparatus shown in FIGS. 1 and 2 will be further described in connection with FIGS. 1 to 4. The resist removing apparatus comprises a tape applying portion 5 (sheet applying portion) for applying a pressure-sensitive adhesive tape 4 to a semiconductor wafer 1 while masking a gate oxide layer 2 formed on the semiconductor wafer 1 which has been removed at unnecessary area and a resist layer 3 formed on the gate oxide layer 2 as a resist pattern and a tape peeling portion 6 (sheet peeling portion) for peeling and separating the pressure-sensitive adhesive tape 4 from the semiconductor wafer 1 to remove the resist layer 3 from the semiconductor wafer 1.

As shown in FIG. 1, the resist removing apparatus further comprises a tape feeding portion 7 for feeding the pressure-sensitive adhesive tape 4, a tape winding portion 8 for winding the pressure-sensitive adhesive tape already used for removing the resist layer 3, and a separator winding portion 9 for winding and recovering a separator 4a which has been peeled off the pressure-sensitive adhesive tape 4 fed by the tape feeding portion 7.

The tape applying portion 5 comprises an application table 5a for supporting the semiconductor wafer 1 during the application of the pressure-sensitive adhesive tape 4 and a vacuum tank 5b for evacuating during the application of the pressure-sensitive adhesive tape 4. The tape peeling portion 6 comprises a peeling table 6a for supporting the semiconductor wafer 1 during the peeling of the pressure-sensitive adhesive tape 4 and an UV irradiation unit 6b for emitting ultraviolet rays.

As shown in FIG. 2, the wafer conveying system of the resist removing apparatus comprises a loading unit 10 for feeding the semiconductor wafer 1 into the wafer conveying system, an aligner unit 11 for positioning the semiconductor wafer 1, a robot unit 12 for gripping and conveying the semiconductor wafer 1, and an unloading unit 13 for receiving the semiconductor wafer 1 which has been processed.

A process for the preparation of the present embodiment of the pressure-sensitive adhesive tape 4 will be described hereinafter.

The term "parts by weight" as used hereinafter means that taking the amount of the main component as 100, the relative amount (ratio by weight) with respect to other components to be blended therewith.

A monomer mixture comprising 80 parts of n-butyl acrylate, 15 parts of ethyl acrylate and 5 parts of acrylic acid was allowed to undergo solution polymerization with 150 parts of ethyl acetate and 0.1 parts of azobisisobutyronitrile at a temperature of 60° C. in a stream of nitrogen for 12 hours to obtain an acrylic polymer solution A having a weight-average molecular weight of 500,000.

To the acrylic polymer solution A were then added a polyethylene glycol diacrylate as a curing compound, dipentaerythritole hexaacrylate, trimethylolpropane triacrylate, diphenylmethane diisocyanate as a polyfunctional compound, and [dimethoxy(phenyl)]methyl phenyl ketone as a photopolymerization initiator in an amount of 10 parts, 10 parts, 30 parts, 3 parts, and 3 parts based on 100 parts of the acrylic polymer, respectively. The mixture was then uniformly stirred to prepare an ultraviolet-curing pressure-sensitive adhesive solution.

The ultraviolet-curing pressure-sensitive adhesive solution was applied to a polyester film having a thickness of 50 μm to provide a dry thickness of 35 μm, and then dried at a temperature of 130° C. for 3 minutes to prepare an ultraviolet-curing pressure-sensitive adhesive tape 4 (i.e., pressure-sensitive adhesive tape 4 having a dry thickness of 85 μm).

The pressure-sensitive adhesive tape 4 exhibited a 180° peel strength (at 25° C.) of 12 g/10 mm width before ultraviolet curing and 10 g/10 mm width after ultraviolet curing with respect to the silicon semiconductor wafer 1.

The present embodiment of the process for the removal of a resist according to the present invention will be described in connection with FIGS. 1 to 4.

The present embodiment of the process for the removal of a resist according to the present invention comprises removing a resist layer 3 formed on a gate oxide layer 2 formed on a semiconductor wafer 1 which has been used as a mask during the etching of the gate oxide layer 2 at unnecessary area with a pressure-sensitive adhesive tape 4.

The present embodiment of the process for the removal of a resist according to the present invention is applied to the case where many gate oxide layers 2 are formed on the semiconductor wafer 1. By way of example, the case where two gate oxide layers 2 are formed on the semiconductor wafer 1 will be described hereinafter.

However, the number of kinds of gate oxide layers 2 to be formed on the semiconductor wafer 1 is not limited to two but may be one or three or more.

As shown in FIG. 3(a), a semiconductor wafer 1 is prepared.

Subsequently, an $Si_3N_4$ layer (silicon nitride) is formed on the semiconductor wafer 1. The $Si_3N_4$ layer thus formed is then pattered as desired. The semiconductor wafer 1 is then selectively oxidized with the $Si_3N_4$ layer as a mask.

The $Si_3N_4$ layer is then removed. The semiconductor wafer 1 is then cleaned to form a gate oxide layer 2 having a thickness of 10 nm as shown in FIG. 3(b).

Thereafter, as shown in FIG. 3(c), a positive-working photoresist comprising a cresol novolak resin, a naphthoquinonediazidesulfonic acid ester of polyhydroxy compound and ethyl lactate is patternwise applied to the semiconductor wafer 1, i.e., gate oxide layer 2 to a thickness of 1 μm to form a resist layer 3.

In some detail, the resist layer 3 is formed as a resist pattern on the gate oxide layer 2 formed on the semiconductor wafer 1.

Thereafter, the gate oxide layer 2 is etched away at unnecessary area using the resist layer 3 as a mask.

In this manner, a resist layer 3 as a resist pattern and a first gate oxide layer 2 corresponding to the resist layer 3 can be formed on the semiconductor wafer 1 as shown in FIG. 3(d).

The semiconductor wafer 1 thus processed is then carried to and received by the loading unit 10 of the resist removing apparatus shown in FIG. 2.

Thereafter, the semiconductor wafer 1 is taken out of the loading unit 10, and then placed on the application table 5a of the tape applying portion 5 under positioning by the aligner unit 11.

Subsequently, a pressure-sensitive adhesive tape 4 is fed from the tape feeding portion 7 shown in FIG. 1. Further, a separator 4a is separated from the semiconductor wafer 1 shortly before the tape applying portion 5. The separator 4a which has been wasted is then wound on the separator winding portion 9.

Thereafter, a vacuum atmosphere of about 10 mm Torr is formed by the vacuum tank 5b. In the vacuum atmosphere, the pressure-sensitive adhesive tape 4 is then applied to the semiconductor wafer 1, with the gate oxide layer 2 and the resist layer 3 left on the semiconductor wafer 1 being masked.

The pressure-sensitive adhesive tape 4 to be used in the present embodiment is of ultraviolet-curing type.

During the application of the pressure-sensitive adhesive tape 4, the application table 5a is heated to a temperature of about 90° C. In this manner, the pressure-sensitive adhesive tape 4 is thermally contact-bonded.

In some detail, a pressure roller 5c provided in the tape application portion 5 is rolled over the pressure-sensitive adhesive tape 4 on the application table 5a thus heated while being pressed against the main plane of the semiconductor wafer 1 so that the pressure-sensitive adhesive tape 4 is applied (thermally contact-bonded) to the semiconductor wafer 1.

The pressure-sensitive adhesive tape 4 is wide enough to cover all over the main plane of the semiconductor wafer 1. Thus, the entire main plane of the semiconductor wafer 1 can be covered by the pressure-sensitive adhesive tape 4 thus applied.

In other words, the pressure-sensitive adhesive tape 4 is applied to the entire main plane of the semiconductor wafer 1 regardless of the area and shape of the circuit pattern.

During this process, when brought into contact with the semiconductor wafer 1, the pressure-sensitive adhesive tape 4 is heated to a raised temperature.

As a result, the pressure-sensitive adhesive contained in the pressure-sensitive adhesive tape 4 softens and then penetrates into and sticks to the resist layer 3.

Thereafter, the robot unit 12 operates to transfer the semiconductor wafer 1 together with the pressure-sensitive adhesive tape 4 onto the peeling table 6a of the tape peeling portion 6 (sheet peeling portion).

Subsequently, the pressure-sensitive adhesive tape 4 on the semiconductor wafer 1 placed on the peeling table 6a is irradiated with ultraviolet rays at a dose of 900 mJ/cm$^2$ from a high pressure mercury vapor lamp provided in the UV irradiation unit 6b.

In this manner, since the pressure-sensitive adhesive tape 4 of the present embodiment is of ultraviolet curing type, the pressure-sensitive adhesive layer which has penetrated into the resist layer 3 cures. Then, the pressure-sensitive adhesive layer of the pressure-sensitive adhesive tape 4 becomes more elastic.

Subsequently, the pressure-sensitive adhesive tape 4 is wound on the tape winding portion 8 while the peeling table 6a is moved in the same direction as that of winding of the pressure-sensitive adhesive tape 4.

Since the pressure-sensitive adhesive tape 4 is moved upward obliquely and wound while the peeling table 6a moves horizontally as shown in FIG. 4 (b), the pressure-sensitive adhesive tape 4 and the semiconductor wafer 1 are separated from each other as they move.

Since the pressure-sensitive adhesive layer which has penetrated into the resist layer 3 cures to render the pressure-sensitive adhesive layer more elastic, the pressure-sensitive adhesive tape 4 can be separated from the semiconductor wafer 1 together with the resist layer 3. In other words, the pressure-sensitive adhesive tape 4 and the resist layer 3 can be separated from the semiconductor wafer 1 in one body.

In this manner, the resist layer 3 and the remaining gate oxide layer 2 can be separated from each other to remove the resist layer 3 from the semiconductor wafer 1.

Thereafter, the semiconductor wafer 1 is cleaned by ultraviolet ozone cleaning (ozone ashing) to remove the residual pressure-sensitive adhesive matter (pressure-sensitive adhesive component from the pressure-sensitive adhesive tape 4) from the semiconductor wafer 1.

The foregoing ozone ashing is effected at, e.g., 200° C. for about 30 seconds.

Subsequently, the semiconductor wafer 1 can be cleaned with ammonia to obtain a cleaned semiconductor wafer 1 and a gate oxide layer 2 left thereon as shown in FIG. 4 (c).

The present embodiment is applied to the case where two gate oxide layers 2 are formed on the semiconductor wafer 1. Thus, after cleaning with ammonia, another gate oxide layer 2, i.e., second gate oxide layer 2 is formed by chemical vapor growth method, with the gate oxide layer 2 left on the semiconductor wafer 1 being masked as shown in FIG. 4 (d). The second gate oxide layer 2 may be formed by thermal oxidation method.

The finished thickness of the second gate oxide layer 2 is 11.5 nm for example.

Thereafter, a gate electrode (not shown) made of tungsten.silicon/poly—Si is formed on the semiconductor wafer 1, i.e., on the gate oxide layer finally formed thereon. In this arrangement, the semiconductor wafer 1 is then subjected to annealing with hydrogen.

If a plurality of gate oxide layers 2, i.e., three or more gate oxide layers 2 are formed, a third gate oxide layer 2 is then formed on the second gate oxide layer 2, followed by the formation of a fourth gate oxide layer 2, and so forth up to N-th gate oxide layer 2. These gate oxide layers are patterned finally.

In accordance with the present embodiment of the process and apparatus for the removal of a resist, the following effects can be exerted.

In other words, the process for the removal of a resist which comprises applying a pressure-sensitive adhesive tape (pressure-sensitive adhesive sheet) to the semiconductor wafer 1, with the gate oxide layer 2 and the resist layer 3 left on the semiconductor wafer 1 being masked, and then peeling and removing the pressure-sensitive adhesive tape 4 together with the resist layer 3 from the semiconductor wafer 1 does not require the use of ashing method (dry removing method), making it possible to easily remove the resist layer 3 without giving any damage on the gate oxide layer 2.

The process for the removal of a resist according to the present invention requires the use of wet removing method neither, eliminating the necessity of using any chemical liquid or solvent.

Accordingly, the resist layer 3 can be removed from the semiconductor wafer 1 without worsening the working atmosphere and giving any stain on the gate oxide layer 2.

As a result, the properties and reliability of the semiconductor circuit formed on the semiconductor wafer 1 can be enhanced. Further, the yield of the semiconductor wafer 1 can be enhanced.

The measurements of the initial breakdown voltage of a gate oxide layer 2 from which a resist layer has been removed by the resist removing process according to the present invention will be described hereinafter in connection with FIG. 5.

FIG. 5 is a graph illustrating the comparison of the defect density caused by the removal of a resist layer 3 by the present embodiment of the process for the removal of a resist according to the present invention with that caused by the removal of a resist layer 3 by a comparative example of the process for the removal of a resist.

In the foregoing comparative example, the resist layer 3 was removed from the semiconductor wafer 1 shown in FIG. 3(d) and described in the foregoing example by means of a sheet form type low damage ashing apparatus. A gate oxide layer 2 was then formed in the same manner as in the foregoing embodiment. An electrode was then formed. The semiconductor wafer 1 was then subjected to annealing. The semiconductor device thus prepared was then evaluated for initial breakdown voltage of gate oxide layer 2.

As can be seen in FIG. 5, the comparative example of the process for the removal of a resist gives a higher defect density than the present embodiment of the process for the removal of a resist, demonstrating that it gives some stain or damage on the gate oxide layer 2.

It can be thus confirmed that the present embodiment of the process for the removal of a resist according to the present invention makes it possible to obtain a good initial breakdown voltage. The present embodiment of the process for the removal of a resist according to the present invention involves the use of a pressure-sensitive adhesive tape 4 that makes it possible to remove a resist layer 3 without giving any damage on the gate oxide layer 2 in the process for the formation of various gate oxide layers 2.

Since the resist layer 3 can be removed without giving any damage on the gate oxide layer 2, another gate oxide layer 2 can be formed on the semiconductor wafer 1 from which the resist layer 3 has been removed, with the first gate oxide layer 2 formed on the semiconductor wafer 1 being masked.

In other words, the reliability of the semiconductor circuit can be enhanced in the process for the formation of various gate oxide layers 2.

Since an ultraviolet-curing pressure-sensitive adhesive tape is used as pressure-sensitive adhesive tape 4, the pressure-sensitive adhesive layer in the pressure-sensitive adhesive tape 4 can be cured when the pressure-sensitive adhesive tape 4 is irradiated with ultraviolet rays.

In this manner, the elasticity of the pressure-sensitive adhesive tape 4 can be enhanced, making it possible to remove the resist layer 3 clearly from the semiconductor wafer 1 when the pressure-sensitive adhesive tape 4 is peeled.

As a result, the reliability of the semiconductor circuit can be enhanced in the process for the formation of various gate oxide layers 2.

The invention worked out by the inventors has been described in detail with reference to an embodiment of the present invention. However, the present invention is not limited to the foregoing embodiment of the present invention. It is to be understood that various changes and modifications may be made in the invention without departing from the spirit and scope thereof.

For example, the present embodiment has been described with reference to the case where as a method for cleaning the semiconductor wafer 1 from which the resist layer 3 has been removed with the pressure-sensitive adhesive layer 4 there is used ozone ashing by which residual pressure-sensitive adhesive matters are removed from the semiconductor wafer 1. Alternatively, the semiconductor wafer 1 may be washed with, e.g., a 4:1 mixture of sulfuric acid and hydrogen peroxide at a temperature of 150° C. for about 10 minutes so that the residual pressure-sensitive adhesive matters are removed. In this manner, impurities such as the residual pressure-sensitive adhesive matters can be removed with sulfuric acid from the gate oxide layer 2 and the semiconductor wafer 1.

Accordingly, the purity of the gate oxide layer 2 can be enhanced, resulting in the enhancement of the reliability of the semiconductor circuit.

The effects attained by typical inventions among the inventions disclosed by the present application will be briefly described hereinafter.

(1) A pressure-sensitive adhesive sheet is applied to a semiconductor substrate, with a gate oxide layer and a resist layer left on the semiconductor substrate being masked. The pressure-sensitive adhesive sheet is then peeled and removed from the semiconductor substrate together with the resist layer. This method does not require the use of ashing method, making it possible to easily remove the resist layer without giving any damage on the gate oxide layer.

(2) The foregoing method does not require the use of wet removing method, eliminating the necessity of using a chemical liquid or solvent. Accordingly, the resist layer can be removed from the semiconductor substrate without worsening the working atmosphere and giving any stain on the gate oxide layer. As a result, the properties and reliability of the semiconductor circuit formed on the semiconductor substrate can be improved. Further, the yield of the semiconductor substrate can be enhanced.

(3) In accordance with the foregoing effects (1) and (2), the reliability of the semiconductor circuit can be enhanced in the process for the formation of various gate oxide layers.

(4) The semiconductor sheet from which the pressure-sensitive adhesive sheet has been removed can be cleaned with a mixture of sulfuric acid and hydrogen peroxide to remove residual pressure-sensitive adhesive matters therefrom. Thus, impurities such as residual pressure-sensitive adhesive matters can be removed from the gate oxide layer and semiconductor substrate with sulfuric acid. In this manner, the purity of the gate oxide layer can be enhanced, making it possible to enhance the reliability of the semiconductor circuit.

While the invention has been described in detail and with reference to specific embodiments thereof, it will be apparent to one skilled in the art that various changes and modifications can be made therein without departing from the spirit and scope thereof.

What is claimed is:

1. A process for the removal of a resist layer formed on a semiconductor substrate, which comprises the steps of:
    (1) forming a gate oxide layer on said semiconductor substrate;
    (2) forming a resist layer as a resist pattern on said gate oxide layer;
    (3) removing said gate oxide layer at unnecessary areas utilizing said resist layer as a mask;
    (4) applying a pressure-sensitive adhesive sheet to said semiconductor substrate such that the gate oxide layer left on the semiconductor substrate and the resist layer are masked; and
    (5) peeling said pressure-sensitive adhesive sheet together with said resist layer off the semiconductor substrate to separate and remove said resist layer from said semiconductor substrate,
    wherein said steps (2) and (3) are consecutive steps.

2. The process for the removal of a resist of claim 1, which further comprises, after peeling said pressure-sensitive adhesive sheet together with said resist layer off the semiconductor substrate, forming at least another gate oxide layer so as to cover said gate oxide layer left on said semiconductor substrate.

3. The process for the removal of a resist of claim 1, which further comprises, after peeling said pressure-sensitive adhesive sheet together with said resist layer off the semiconductor substrate, removing the residual pressure-sensitive adhesive matters adhered to said semiconductor substrate by ultraviolet ozone cleaning.

4. The process for the removal of a resist of claim 1, which further comprises, after peeling said pressure-sensitive adhesive sheet together with said resist layer off the semiconductor substrate, removing the residual pressure-sensitive adhesive matters adhered to said semiconductor substrate by cleaning with a mixture of sulfuric acid and hydrogen peroxide.

5. The process for the removal of a resist of claim 1, wherein said pressure-sensitive adhesive sheet is an ultraviolet-curing pressure-sensitive adhesive tape.

6. The process for the removal of a resist of claim 1, wherein the application of the pressure-sensitive adhesive sheet to the semiconductor substrate in step (4) is conducted with thermal contact-bonding.

7. A process for the removal of a resist layer formed on a semiconductor substrate, which consists of the steps of:
    (1) forming a gate oxide layer on said semiconductor substrate;
    (2) forming a resist layer as a resist pattern on said gate oxide layer;
    (3) removing said gate oxide layer at unnecessary areas utilizing said resist layer as a mask;
    (4) applying a pressure-sensitive adhesive sheet to said semiconductor substrate such that the gate oxide layer left on the semiconductor substrate and the resist layer are masked; and
    (5) peeling said pressure-sensitive adhesive sheet together with said resist layer off the semiconductor substrate to separate and remove said resist layer from said semiconductor substrate.

8. A process for the removal of a resist layer formed on a semiconductor substrate, which consists of the steps of:
    (1) forming a gate oxide layer on said semiconductor substrate;
    (2) forming a resist layer as a resist pattern on said gate oxide layer;
    (3) removing said gate oxide layer at unnecessary areas utilizing said resist layer as a mask;
    (4) applying a pressure-sensitive adhesive sheet to said semiconductor substrate such that the gate oxide layer left on the semiconductor substrate and the resist layer are masked;
    (5) peeling said pressure-sensitive adhesive sheet together with said resist layer off the semiconductor substrate to separate and remove said resist layer from said semiconductor substrate; and
    (6) forming at least another gate oxide layer so as to cover said gate oxide layer left on said semiconductor substrate.

9. A process for the removal of a resist layer formed on a semiconductor substrate, which consists of the steps of:
    (1) forming a gate oxide layer on said semiconductor substrate;

(2) forming a resist layer as a resist pattern on said gate oxide layer;

(3) removing said gate oxide layer at unnecessary areas utilizing said resist layer as a mask;

(4) applying a pressure-sensitive adhesive sheet to said semiconductor substrate such that the gate oxide layer left on the semiconductor substrate and the resist layer are masked;

(5) peeling said pressure-sensitive adhesive sheet together with said resist layer off the semiconductor substrate to separate and remove said resist layer from said semiconductor substrate; and (6) removing residual pressure-sensitive adhesive matters adhered to said semiconductor substrate by ultraviolet ozone cleaning.

10. A process for the removal of a resist layer formed on a semiconductor substrate, which consists of the steps of:

(1) forming a gate oxide layer on said semiconductor substrate;

(2) forming a resist layer as a resist pattern on said gate oxide layer;

(3) removing said gate oxide layer at unnecessary areas utilizing said resist layer as a mask;

(4) applying a pressure-sensitive adhesive sheet to said semiconductor substrate such that the gate oxide layer left on the semiconductor substrate and the resist layer are masked;

(5) peeling said pressure-sensitive adhesive sheet together with said resist layer off the semiconductor substrate to separate and remove said resist layer from said semiconductor substrate; and (6) removing residual pressure-sensitive adhesive matters adhered to said semiconductor substrate by cleaning with a mixture of sulfuric acid and hydrogen peroxide.

11. The process for the removal of a resist of claim 7, wherein said pressure-sensitive adhesive sheet is an ultraviolet-curing pressure-sensitive adhesive tape.

12. The process for the removal of a resist of claim 7, wherein the application of the pressure-sensitive adhesive sheet to the semiconductor substrate in step (4) is conducted with thermal contact-bonding.

* * * * *